(12) United States Patent
Siligaris et al.

(10) Patent No.: US 9,209,748 B2
(45) Date of Patent: Dec. 8, 2015

(54) FREQUENCY SYNTHESIS DEVICE AND METHOD

(71) Applicant: Commissariat a l'energie atomique et aux ene alt, Paris (FR)

(72) Inventors: Alexandre Siligaris, Grenoble (FR); Clement Jany, Grenoble (FR)

(73) Assignee: Commissariat á l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/361,643

(22) PCT Filed: Nov. 30, 2012

(86) PCT No.: PCT/EP2012/074136
§ 371 (c)(1),
(2) Date: May 29, 2014

(87) PCT Pub. No.: WO2013/079685
PCT Pub. Date: Jun. 6, 2013

(65) Prior Publication Data
US 2014/0323062 A1  Oct. 30, 2014

(30) Foreign Application Priority Data
Nov. 30, 2011  (FR) ..................................... 11 60955

(51) Int. Cl.
*H04B 1/405*  (2015.01)
*H03B 21/02*  (2006.01)
(Continued)

(52) U.S. Cl.
CPC  *H03B 21/02* (2013.01); *H03L 7/18* (2013.01); *H03L 7/24* (2013.01); *H04B 1/50* (2013.01); *H04B 1/7174* (2013.01)

(58) Field of Classification Search
CPC ........................................................ H04B 1/50
USPC .................................... 455/76, 255, 315, 323
See application file for complete search history.

(56) References Cited

U.S. PATENT DOCUMENTS
2009/0175116 A1  7/2009  Song et al.

FOREIGN PATENT DOCUMENTS
WO  2008 069444  6/2008

OTHER PUBLICATIONS

A. Siligaris, et al., "A 60 GHz UWB impulse radio transmitter with integrated antenna in CMOOS65nm SOI technology", Silicon Monolithic Integrated Circuits in RF Systems (SiRF), 2011 IEEE 11$^{th}$ Topical Meeting on , Jan. 17-19, 2011, pp. 153-156.

(Continued)

*Primary Examiner* — Tuan H Nguyen
(74) *Attorney, Agent, or Firm* — Oblon, McClelland, Maier & Neustadt, L.L.P.

(57) ABSTRACT

A frequency synthesis device including: a first generator configured to generate a periodic signal of frequency $f_1$; a second and third generator, coupled with the first generator and configured to receive as an input the periodic signal of frequency $f_1$ and to generate a signal $S_G$ corresponding to a train of oscillations of frequency substantially equal to $N \cdot f_1$, of a time less than $T_1 = 1/f_1$ and repeated periodically at the frequency $f_1$, where N is a whole number greater than 1; and a fourth generator configured to generate, from the signal $S_G$, a periodic signal wherein a frequency spectrum includes a primary line of frequency $f_2 = (N+i) \cdot f_1$, where i is a whole number.

13 Claims, 9 Drawing Sheets

(51) Int. Cl.
  *H03L 7/18* (2006.01)
  *H03L 7/24* (2006.01)
  *H04B 1/717* (2011.01)
  *H04B 1/50* (2006.01)

(56) References Cited

OTHER PUBLICATIONS

Olivier Richard, et al., "A17.5-to-20.94GHz and 35-to-41.88GHz PLL in 65nm CMOS for Wireless HD Applications", Solid-State Circuits Conference Digest of Technical Papers (ISSCC), 2010 IEEE International, Feb. 7-11, 2010, pp. 252-253.

Marc Tiebout, et al., "A 50 GHz direct injection locked oscillator topology as low power frequency divider in 0.13 μm CMOS", , Solid-State Circuits Conference, 2003, ESSCIRC 03. Proceedings of the 29$^{th}$ European, pp. 73-76, Sep. 16-18, 2003.

Xu, R., "Power-Efficient Switching-Based CMOS UWB Transmitters for Uwb Communications and Radar Systems", IEEE Transactions on Microwave Theory and Techniques, vol. 54, No. 8, pp. 3271-3277, (Aug. 1, 2006) XP001545203.

Khan, N. et al., "A Low Power Frequency Synthesizer for 60-GHz Wireless Personal Area Networks", IEEE Transactions on Circuits and Systems II: Express Briefs, vol. 58, No. 10, pp. 622-626, (Oct. 1, 2011) XP011363375.

Harjani, R. et al., "Fast Hopping Injection Locked Frequency Generation for UWB", Ultra-Wideband, IEEE, pp. 502-507, (Sep. 1, 2007) XP031159403.

International Search Report Issued Jan. 10, 2013 in PCT/EP12/074136 Filed Nov. 30, 2012.

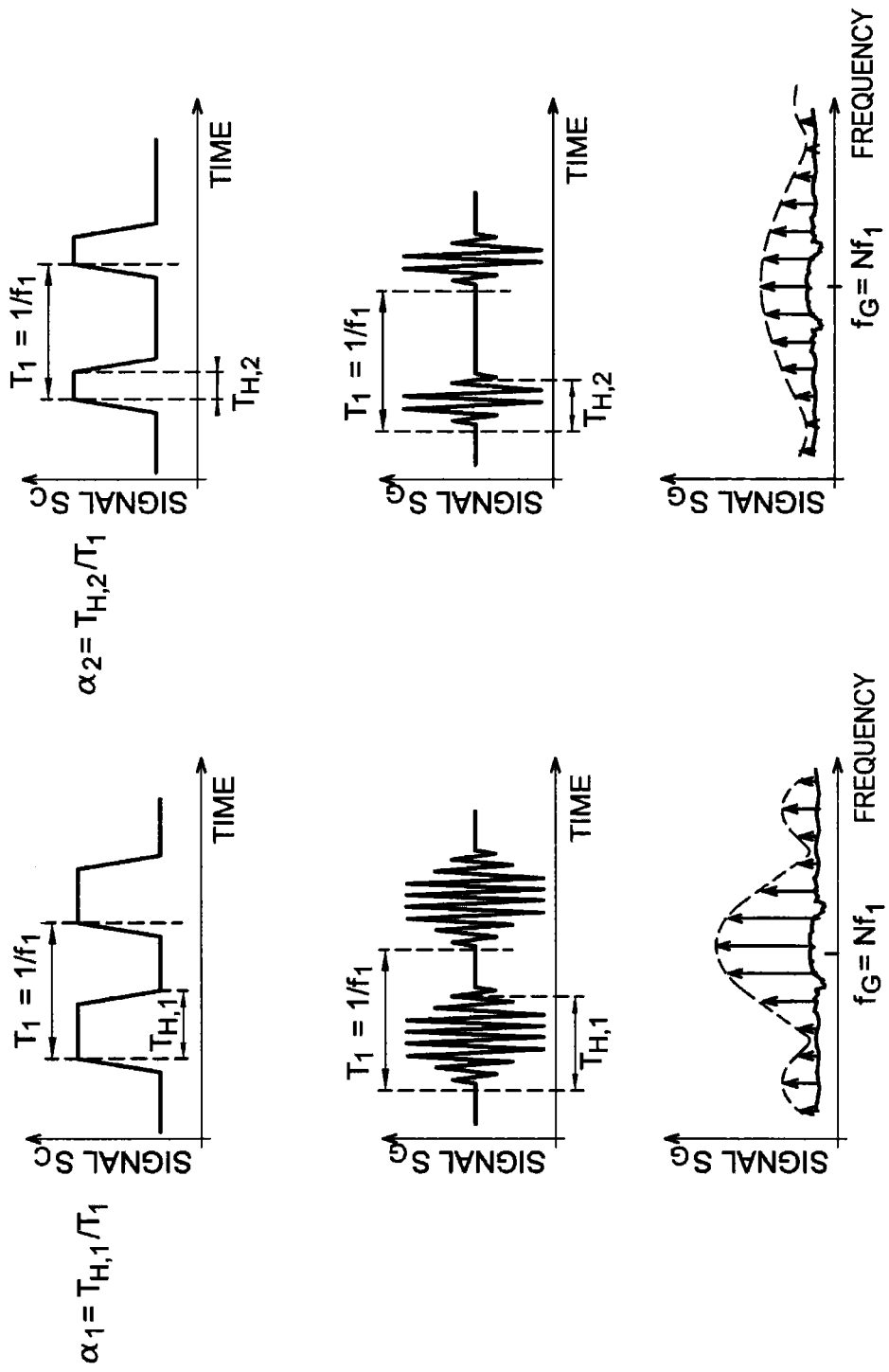

FREQUENCY SYNTHESIS DEVICE AND METHOD

FIELD OF THE INVENTION

The invention relates to a frequency synthesis device and method for supplying a stable signal of a predetermined frequency from a signal of lower frequency. The invention also relates to a device for transmitting and/or receiving signals, operating for example in the radiofrequency (RF) range, comprising such a frequency synthesis device for outputting a stable periodic signal.

STATE OF THE RELATED ART

A frequency synthesis device is suitable for supplying a frequency-stable signal intended to be used for example in an RF communication system. In this way, during a signal transmission, a signal containing the information to be sent can be modulated with the frequency-stable signal acting as the carrier signal for conveying the information.

The frequency synthesis performed defines in this case the value of the transmission carrier frequency. During signal reception, frequency synthesis makes it possible to supply this frequency-stable signal to demodulate the information received.

A first example of an embodiment of a frequency synthesis device 10, used for example in a carrier frequency transmission/reception system, is shown in FIG. 1.

The device 10 comprises a voltage-controlled oscillator 12 (VCO), outputting a sinusoidal signal wherein the oscillation frequency is controlled by a voltage applied at the input of the oscillator 12. The oscillator 12 is embodied such that it can output an oscillating signal in the band of frequencies used by the communication system including the device 10.

The oscillator 12 is considered to output a sinusoidal signal having the frequency $f_1$.

The output signal supplied by the oscillator 12 alone is unstable in the RF and microwave frequency bands, drifts over time and has a high spectral impurity (phase noise). It thus needs to be stabilised in respect of frequency by locking (i.e. by setting, or synchronising) the phase thereof on that of a very frequency-stable signal supplied for example by a very high-quality resonator, such as a quartz resonator, operating however at a lower frequency (generally in the MHz range).

In order to lock the signal phase output by the oscillator 12 and thus stabilise the oscillation frequency $f_1$ of this signal, the oscillator 12 is controlled within a phase-locked loop (PLL). This PLL comprises a plurality of serially interconnected frequency dividers (represented in the form of a single element referenced 14 in FIG. 1) and suitable for dividing together the frequency $f_1$ of the signal output by the oscillator 12 by a whole or fractional number N.

At the output of the frequency dividers 14, a periodic signal of frequency $f_1/N$ is obtained, which is then compared to a very stable reference periodic signal, such as a signal having a frequency $f_{quartz}$ supplied by a quartz resonator 16. The frequency dividers 14 are embodied such that the factor N obtained enables the frequency $f_1/N$ to be close to the frequency $f_{quartz}$. These two signals are compared by a phase comparator 18 (or PFD for "Phase Frequency Detector") generating an output signal proportional to the phase difference measured between these two signals and wherein the value is positive or negative according to the sign of the difference $f_1/N - f_{quartz}$. This output signal is sent as an input to a charge pump circuit and a filter 20 outputting a signal applied to the control input of the oscillator 12 suitable for adjusting the oscillation frequency thereof such that $f_1/N = f_{quartz}$ once the loop has stabilised.

With such a frequency synthesis device 10, the frequency stability of the signal of frequency $f_1$ output by the oscillator 12, the drift thereof over time and the spectral purity thereof are essentially dependent on the characteristics of the reference signal of frequency $f_{quartz}$ supplied by the resonator 16 and the division rank N of the frequency dividers 14. Furthermore, the frequencies synthesised by the device 10 are also dependent on the oscillation frequency range of the oscillator 12 such that:

$$f_{oscmin} < N \cdot f_{quartz} < f_{oscmax}$$

$f_{oscmin}$ and $f_{oscmax}$ being respectively the minimum and maximum oscillation frequencies of the oscillator 12.

The oscillator 12 is for example embodied in the form of differential crossed pairs (resonator coupled with a negative resistance). The frequency dividers 14 use various architectures according to whether they are positioned at the start of a chain (close to the frequency $f_1$, i.e. at the end of the oscillator 12) or at the end of a chain, to a lower frequency (close to the frequency $f_{quartz}$, i.e. at the end of the phase frequency detector 18). At high frequencies, the frequency dividers use CML (Current Mode Logic) or ILFD (Injection Locked Frequency Divider) type circuits. Frequency dividers operating at lower frequencies use merely numeric counter type architectures. The circuits acting as the frequency dividers 14 may be programmable so that the value of the frequency synthesised by the device 10 is programmable ($f_1$ is as such a multiple of $f_{quartz}$) via the choice of the value of N (the value of $f_{quartz}$ is dependent on the type of resonator 16 and is thus not programmable).

This type of frequency synthesis device 10 involves the major drawback of using a long chain of frequency dividers 14 given the high value of N when the difference between $f_{quartz}$ and $f_1$ is great. The first frequency dividers (those at the oscillator 12 end) operating at high frequencies have a high static electricity consumption. Furthermore, when the first frequency dividers use an ILFD type architecture, in this case, they use resonant elements (inductors or transmission lines) occupying a large circuit area.

Moreover, the PLL uses feedback acting on the oscillation frequency of the oscillator 12. However, this feedback may give to instabilities in the PLL (non-locking of the frequency $f_1$) in that this loop operates at a high frequency.

A second example of an embodiment of a frequency synthesis device 30, used in a high carrier frequency transmission/reception system (RF range), is represented in FIG. 2.

In relation to the device 10 described above, this second frequency synthesis device 30 uses an opposite approach consisting of multiplying the reference frequency $f_{quartz}$ until the required frequency $f_1$ is obtained. As shown in FIG. 2, such a device 30 comprises a resonator 16, for example similar to that of the device 10 described above, outputting the reference stable signal of frequency $f_{quartz}$. This signal is applied at the input of a chain of frequency multiplier circuits 32 of rank N (shown in the form of a single element in FIG. 2) suitable for outputting the signal of frequency $f_1 = N \cdot f_{quartz}$.

The device 30 does not comprise an oscillator or a phase-locked loop. The first frequency multiplier circuits 32 (those situated at the resonator 16 end) operate at low frequencies and use standard numeric architectures. On the other hand, the frequency multiplier circuits 32 situated at the end of the chain operate at high frequencies and use subharmonic locking architectures, or make use of "push-push", distortion, harmonic amplification or other techniques. The stability and purity of the signal (phase noise) of frequency $f_1$ obtained at the output of the frequency synthesis device 30 are essentially dependent on the characteristics of the stable reference signal supplied by the resonator 16 and the multiplication rank N.

When the multiplication rank N is high (which is the case for a frequency synthesis device including in an RF communication system), it is necessary to use a large number of frequency multiplier circuits to produce the chain 32, giving rise to a high consumption and large occupied circuit area. Furthermore, there is no programmable frequency multiplier circuit, rendering the rank N fixed and not enabling the device 30 to synthesise frequencies in a programmable manner.

A third example of an embodiment of a frequency synthesis device 40, used for example in a high carrier frequency transmission/reception system (RF), is shown in FIG. 3.

The architecture of the device 40 consists of a combination of the architectures of the frequency synthesis devices 10 and 30 described above. A first frequency synthesis is performed at the frequency $f_1$ using a similar architecture to that of the device 10 (making use of elements equivalent to the elements 12, 14, 16, 18, 20 of the device 10). The frequency signal $f_1$ is then multiplied by a chain of frequency multiplier circuits 42 of rank K in order to obtain an output signal of frequency $f_2=K.f_1=K.N.f_{quartz}$.

Such a device 40 has the advantage of being capable of synthesising programmable frequencies (via the programming of the parameter N) and increasing the value of the frequency suitable for being obtained at the output. The frequencies suitable for being synthesised are such that:

$$f_{oscmin} < N \cdot K \cdot f_{quartz} < f_{oscmax}$$

Although the frequency synthesis device 40 solves some of the drawbacks of the frequency synthesis devices 10 and 30, all these frequency synthesis devices involve the drawback of making use of complete chains of frequency dividers and/or multipliers of high ranks (N and K suitable for being in the region of several hundred or several thousand), due to the major differences between the carrier frequency values to be obtained at the output of the devices and the relatively low frequencies suitable for being supplied by stable resonators such as quartz resonators.

However, these complete frequency divider or multiplier circuit chains have a high electricity consumption and also occupy a large circuit area.

DESCRIPTION OF THE INVENTION

One aim of the invention is that of providing a novel type of frequency synthesis device not involving the drawbacks of the frequency synthesis devices of the prior art described above.

For this, it relates to a frequency synthesis device, comprising at least:
first means suitable for generating a periodic signal of frequency $f_1$,
second means suitable for generating a periodic pulse signal wherein a central frequency $f_G$ is equal to $N.f_1$, where N is a whole number greater than 1,
third means coupled with the first and second means, suitable for receiving as an input the periodic signal of frequency $f_1$ and actuating the generation of the periodic pulse signal by the second means merely on a portion of each period of the periodic signal of frequency $f_1$,
fourth means suitable for generating, using the periodic pulse signal output by the second means, a periodic, for example sinusoidal, signal of frequency $f_2=(N+i).f_1$, where i is a whole number.

The present invention further relates to a frequency synthesis device, comprising at least:
first means, or first generator, suitable for generating a periodic signal of frequency $f_1$,
second and third means, or a second generator, coupled with the first means and suitable for receiving as an input the periodic signal of frequency $f_1$ and generating a signal $S_G$ corresponding to a train, or a set, of oscillations of frequency substantially equal to $N.f_1$, of a time less than $T_1=1/f_1$ and repeated periodically at the frequency $f_1$, where N is a whole number greater than 1,
fourth means, or a third generator, suitable for generating, from the signal $S_G$, a periodic, for example sinusoidal, signal, wherein the frequency spectrum comprises a primary line, or primary peak, of frequency $f_2=(N+i).f_1$, where i is a whole number.

Such a device is suitable for carrying out frequency synthesis which is stabilised in respect of frequency and noise. This device is based on a frequency multiplication of a signal, or more specifically a generation, using a low frequency, of a complex periodic signal centred at a higher frequency, and a subsequent frequency recovery so as to obtain a stabilised signal in respect of frequency. Indeed, the second and third means generate, for example via the control carried out by the third means on the second means, a periodic pulse signal wherein the central frequency $f_G$ is a multiple of a first generated signal of frequency $f_1$. The third means may actuate the second means as a control switch operating at the frequency $f_1$. In this way, the spectrum of the signal output by the second means and third means, corresponding for example to a sinusoidal pulse signal, or more generally a signal corresponding to an oscillations train of frequency substantially equal to $N.f_1$, of a time $T_H$ less than $T_1=1/f_1$ and repeated periodically at the frequency $f_1$, where N is a whole number greater than 1, comprises a plurality of lines centred about the central frequency $f_G=N.f_1$ and at intervals of $f_1$. The fourth means then serve to recover, in this spectrum, the sought line and generate a stable periodic signal, for example sinusoidal or having a substantially sinusoidal shape, of central frequency $f_2=(N+i).f_1$.

The device according to the invention is thus suitable for carrying out high-frequency synthesis ($f_2$) using a low-frequency signal (frequency $f_1$) and a high-frequency pulse generator formed by the second and third means.

The device according to the invention is suitable for carrying out, between the frequency $f_1$ and the frequency $f_2$ output, a high-ranking frequency multiplication without involving the drawbacks of the frequency multipliers of the prior art. The device according to the invention does not use a conventional frequency multiplier chain as in some of the frequency synthesis devices according to the prior art and thus has the advantage of reducing the consumption and size of the frequency synthesis device. Furthermore, the frequency synthesised is programmable by programming the parameters N and i.

The device according to the invention thus has the advantage, in relation to the frequency synthesis devices according to the prior art comprising long frequency multiplier or divider chains, of reducing the electricity consumption of the device, enhancing the performances of the frequency synthesis carried out in terms of phase noise and frequency operating range, and also reducing the complexity of the design of the device.

The frequency synthesis device according to the invention does not require a long frequency divider chain (giving rise to high consumption and a large occupied area), or a PLL operating at high frequency (giving rise to instabilities at high frequencies).

The signal output by the fourth means may correspond to a periodic signal wherein the frequency spectrum comprises lines of whole multiple frequencies of $f_1$ and wherein the primary line (exhibiting the greatest amplitude from the set of spectral lines) is at the frequency $f_2=(N+i)f_1$.

The invention also relates to a frequency synthesis device comprising at least:
  means suitable for generating a periodic signal of frequency $f_1$,
  means suitable for generating, from the periodic signal of frequency $f_1$, a periodic pulse signal wherein a central frequency $f_G$ is equal to $N.f_1$, where N is a whole number greater than 1, the periodic pulse signal periodically having a zero value on a portion of the period of the periodic signal of frequency $f_1$,
  means suitable for generating, from the periodic pulse signal of central frequency $f_G$ equal to $N.f_1$, a periodic, for example sinusoidal, signal of frequency $f_2=(N+i).f_1$, where i is a whole number.

The second means may comprise at least one voltage-controlled oscillator wherein the free oscillation range includes the central frequency $f_G$, i.e. $N.f_1$, the value of N optionally being dependent on a value of a first control voltage to be applied at the input of the voltage-controlled oscillator. The free oscillation range may be defined as being the frequency range between the minimum frequency and the maximum frequency suitable for being reached by the voltage-controlled oscillator according to the first control voltage.

The third means may be suitable for generating a supply voltage of the second means in the form of a further periodic signal of frequency $f_1$ wherein the cyclic ratio may be less than 1.

The third means may comprise at least one switch connected to an electrical power supply input of the second means and suitable for being controlled by the periodic signal of frequency $f_1$ to be generated by the first means.

The third means may comprise at least one switch connected to an electrical power supply input of the oscillator and suitable for being controlled by the periodic signal of frequency $f_1$ such that it generates a non-zero oscillator power supply voltage merely during a portion of each period $T_1$.

The third means may comprise at least one switch connected to an oscillator output and suitable for being controlled by the periodic signal of frequency $f_1$ such that it breaks an electrical connection between the oscillator output and the input of the fourth means during a portion of each period $T_1$.

The fourth means may comprise at least one injection-locked oscillator intended to receive, as an input, the periodic pulse signal of central frequency $f_G$ (which is periodically interrupted at the frequency $f_1$) generated by the second means, or the signal $S_G$, and to be locked at least periodically at the frequency $f_2$, the value of i optionally being dependent on a value of a second control voltage intended to be applied at the input of the injection-locked oscillator. This/these injection-locked oscillators may carry out recovery of at least one of the lines, corresponding to the frequency $f_2$, of the spectrum of the signal output by the second means.

The fourth means may comprise at least one band-pass filter of central frequency substantially equal to $f_2$.

The value of the frequency $f_1$ may be greater than approximately 1 GHz, and/or the value of the frequency $f_2$ may be greater than approximately 10 GHz, and/or the periodic pulse signal generated by the second means may be a sinusoidal pulse signal, and/or the oscillations of the signal $S_G$ may be sinusoidal, and/or the periodic signal of frequency $f_2$, or more generally the periodic signal wherein the frequency spectrum comprises a primary line of frequency $f_2$, may be a substantially sinusoidal signal.

The first means may comprise at least one resonating device and a phase-locked loop suitable for controlling the phase of the periodic signal of frequency $f_1$ output by a voltage-controlled oscillator of the phase-locked loop on a phase of a periodic signal, for example a sinusoidal signal, output by the resonating device. In this way, the frequency synthesis device may make use of a phase-locked loop operating at a low frequency, making it possible to eliminate the risks of instability induced by a PLL operating at a high frequency as in the prior art.

Alternatively, the first means may also comprise a resonating device suitable for generating the periodic signal, which is stable, of frequency $f_1$.

The invention also relates to a signal transmission and/or reception device, comprising at least one frequency synthesis device as defined above and coupled with a modulator and/or a demodulator of the transmission and/or reception device.

The invention also relates to a frequency synthesis method, comprising at least steps for:
  generating a periodic signal of frequency $f_1$,
  generating, from the periodic signal of frequency $f_1$, a periodic pulse signal wherein a central frequency $f_G$ is equal to $N.f_1$, where N is a whole number greater than 1, the periodic pulse signal having periodically a non-zero value merely on a portion of each period of the periodic signal of frequency $f_1$,
  generating, from the periodic pulse signal of central frequency $f_G$, a periodic signal of frequency $f_2=(N+i).f_1$, where i is a whole number.

The present invention further relates to a frequency synthesis method, comprising at least steps for:
  generating a periodic signal of frequency $f_1$,
  generating, from the periodic signal of frequency $f_1$, a signal $S_G$ corresponding to a train, or a set, of oscillations of frequency substantially equal to $N.f_1$, of a time less than $T_1=1/f_1$ and repeated periodically at the frequency $f_1$, where N is a whole number greater than 1,
  generating, from the signal $S_G$, a periodic signal of frequency $f_2=(N+i).f_1$, where i is a whole number.

The fact that the periodic pulse signal generated by the second means has a non-zero value merely on a portion of each period of the periodic signal of frequency $f_1$ means that this pulse signal periodically has a zero value on a portion of the period of the periodic signal of frequency $f_1$.

The present invention also relates to a frequency synthesis method, comprising at least steps for:
  generating a periodic signal of frequency $f_1$,
  generating, from the periodic signal of frequency $f_1$, a signal $S_G$ corresponding to a train, or a set, of oscillations of frequency substantially equal to $N.f_1$, of a time less than $T_1=1/f_1$ and repeated periodically at the frequency $f_1$, where N is a whole number greater than 1,
  generating, from the signal $S_G$, a periodic signal wherein the frequency spectrum comprises a primary line of frequency $f_2=(N+i).f_1$, where i is a whole number.

The invention also relates to a method for producing a frequency synthesis device, comprising at least steps for:
  producing first means suitable for generating a periodic signal of frequency $f_1$,
  producing second means suitable for generating a periodic pulse signal wherein a central frequency $f_G$ is equal to $N.f_1$, where N is a whole number greater than 1, producing third means coupled with the first and second means, suitable for receiving, as an input, the periodic signal of frequency $f_1$ and controlling the generation of the periodic pulse signal by the second means merely on a portion of each period of the periodic signal of frequency $f_1$, producing fourth means suitable for generating, from the periodic pulse signal output by the second means, a periodic signal of frequency $f_2=(N+i).f_1$, where i is a whole number.

The invention finally relates to a method for producing a frequency synthesis device, comprising at least steps for:

producing first means suitable for generating a periodic signal of frequency $f_1$, producing second and third means, coupled with the first means and suitable for receiving as an input the periodic signal of frequency $f_1$ and generating a signal $S_G$ corresponding to a train, or a set, of oscillations of frequency substantially equal to $N.f_1$, of a time less than $T_1=1/f_1$ and repeated periodically at the frequency $f_1$, where N is a whole number greater than 1, producing fourth means suitable for generating, from the signal $S_G$, a periodic signal wherein the frequency spectrum comprises a primary line of frequency $f_2=(N+i).f_1$, where i is a whole number.

BRIEF DESCRIPTION OF THE FIGURES

The present invention will be understood more clearly on reading the description of examples of embodiments given merely as an indication and being in no way limiting with reference to the appended figures wherein:

FIGS. 9A and 9B represent waveforms and spectra of the signals generated in a frequency synthesis device, according to the present invention.

Identical, similar or equivalent parts of the various figures described hereinafter bear the same reference numbers for easier transition from one figure to another.

The various parts represented in the figures are not necessarily based on a uniform scale, so as to render the figures more legible.

The various options (alternatives and embodiments) should be understood as not being mutually exclusive and suitable for being combined with each other.

DETAILED DESCRIPTION OF PARTICULAR EMBODIMENTS

Figure 1:
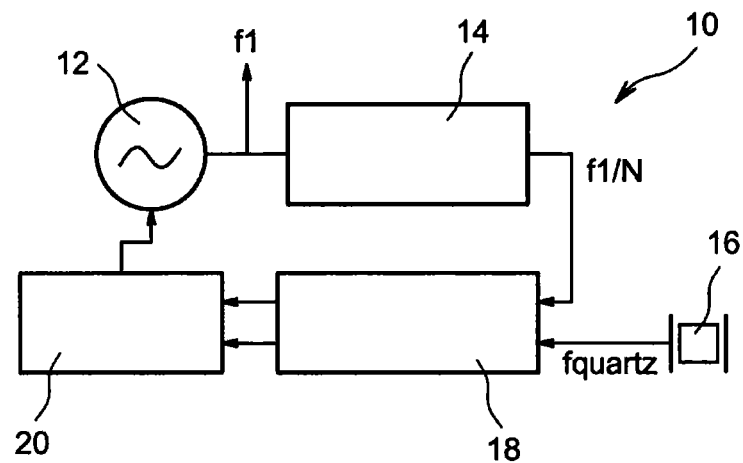
FIGS. 1 to 3 schematically represent frequency synthesis devices according to the prior art, FIG. 4 schematically represents a frequency synthesis device, according to the present invention, according to a first embodiment, FIGS. 5A and 5B respectively represent the waveform and the spectrum of a signal $S_C$ generated in a frequency synthesis device, according to the present invention, FIGS. 6A and 6B respectively represent the waveform and the spectrum of a signal $S_G$ generated in a frequency synthesis device, according to the present invention, FIGS. 7A and 7B respectively represent the waveform and the spectrum of a signal $S_2$ obtained at the output of a frequency synthesis device, according to the present invention.
Figure 2:
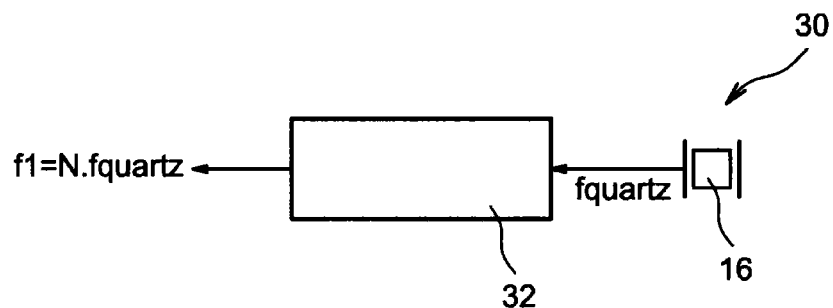
Figure 3:
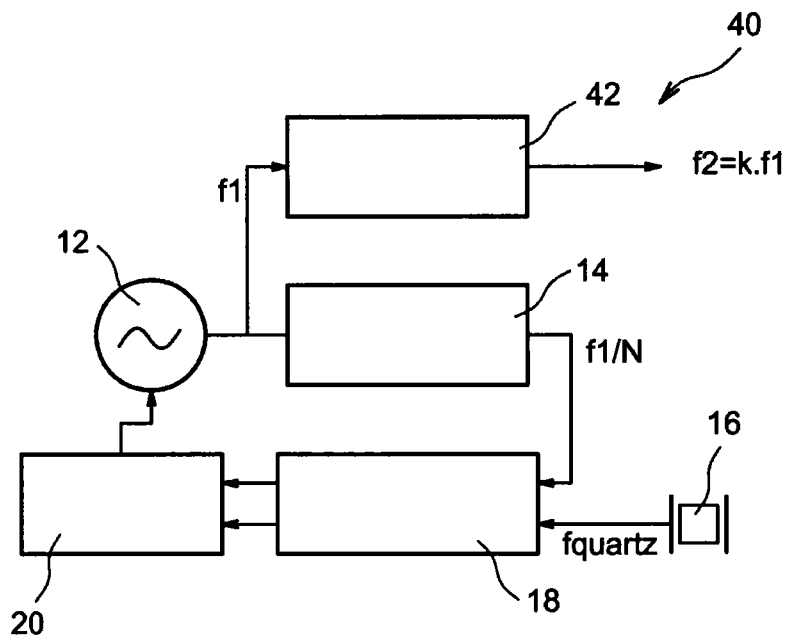
Figure 4:
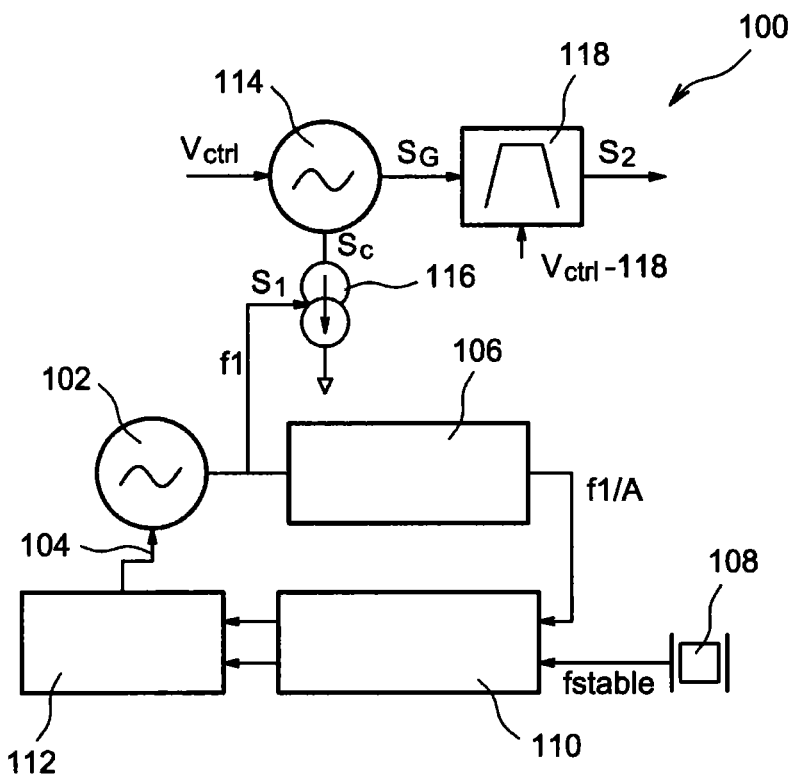

Reference is first made to FIG. 4 representing a frequency synthesis device 100 according to a first embodiment.

The device 100 comprises an oscillator 102 for example of the VCO type outputting a periodic signal $S_1$ of frequency $f_1$, for example sinusoidal of oscillation frequency $f_1$. The frequency $f_1$ is controlled by a voltage applied on a control input 104 of the oscillator 102. In order to lock and stabilise the oscillation frequency $f_1$ of the signal $S_1$, the oscillator 102 is controlled by a phase-locked loop (PLL). This PLL comprises one or a plurality of frequency dividers 106 suitable for dividing the frequency of the signal $S_1$ by a whole or fractional number A. At the output of the frequency divider(s) 106, a periodic signal of frequency $f_1/A$ which is then compared to a very stable reference periodic signal of frequency $f_{stable}$ supplied by a resonator 108, for example a quartz resonator is obtained. The factor A is chosen such that the frequency $f_1/A$ is close to the frequency $f_{stable}$. These two signals are compared by a phase frequency detector 110 (PFD) generating an output signal proportional to the phase difference measured between these two signals, wherein the value is positive or negative according to the sign of the difference $f_1/A - f_{stable}$.

This output signal is sent as an input to a charge pump circuit and a filter 112 outputting the signal applied to the control input 104 of the oscillator 102 so as to adjust the oscillation frequency $f_1$, such that $f_1/A=f_{stable}$.

The elements 102, 106, 108, 110 and 112 are suitable for obtaining a periodic, for example sinusoidal, signal $S_1$, which is stable in respect of frequency. Alternatively, it is possible to replace these elements 102, 106, 108, 110 and 112 by any device or structure suitable for supplying such a frequency-stable periodic signal $S_1$, corresponding for example to a single resonating device if such a resonating device can supply the signal $S_1$ directly. The choice of the type of device or structure generating the periodic signal $S_1$ may notably be performed according to the sought frequency $f_1$. A resonating device alone may be sufficient if the frequency $f_1$ does not exceed a value above which it may then be necessary to make use of a PLL to generate the signal $S_1$.

The frequency synthesis device 100 further comprises a generator of a periodically repeated oscillations train (hereinafter referred to as "PROT") in the band of frequencies to be synthesised and a frequency recovery device.

In this first embodiment, the PROT generator comprises a VCO type oscillator 114 voltage-controlled by a control signal $V_{ctrl}$, and controlled electrical power supply means 116 electrically powering the oscillator 114 and which are controlled by the signal $S_1$ of frequency $f_1$ output by the oscillator 102.

In the example in FIG. 4, this controlled electrical power supply corresponds to a controlled current source 116 operating as a switch periodically breaking (period $T_1=1/f_1$) the electrical power supply of the oscillator 114. This controlled current source may corresponds to an MOS transistor comprising a gate whereon the signal $S_1$ is applied. As a general rule, these means 116 may comprise a switch connected to an electrical power supply input of the oscillator 114 and suitable for being controlled by the periodic signal $S_1$.

The oscillator 114 is thus switched by this switch alternatively setting the oscillator 114 to ON and OFF, i.e. breaking or not the supply of an output signal by the oscillator 114, successively at the frequency $f_1$. The oscillator 114 is controlled by a signal $S_C$ corresponding to the current generated by the current source 116 (and thus to the power supply voltage supplied to the oscillator 114) and wherein the waveform substantially corresponds to a positive square signal of frequency $f_1$ (this square signal is not perfect and may have a trapezoidal shape, as is the case of the signal $S_C$ represented in FIG. 5A). In this way, when the switching signal $S_C$ starts up the oscillator 114, a signal $S_G$ corresponding to an oscillations train is created at the VCO output. A half-period $T_1/2$ (where $T_1=1/f_1$) later, the oscillator 114 is switched off and the oscillation is interrupted. Alternating the ON and OFF every half-period $T_1/2$ corresponds to the scenario where the signal $S_C$ has a cyclic ratio equal to 0.5. The signal $S_C$ represented in FIG. 5A switches on the oscillator 114 for a time $T_H$ which is equal, in this example, to $T_1/2$.

However, this cyclic ratio (equal to $T_H/T_1$) may be different to 0.5, and more generally between 0 and 1, the values 0 and 1 being excluded, the time of the ON state optionally being greater or less than that of the OFF state.

In this way, a pulsed signal $S_G$ is created at a central frequency $f_{OL}$, corresponding to the free oscillation frequency of the oscillator 114, with a repetition period equal to $T_1$. The signal $S_G$ thus corresponds to a PROT, i.e. in this instance a train, or a set, of oscillations of frequency $f_{OL}$, of a time less than $T_1=1/f_1$ and repeated periodically with a repetition period equal to $T_1$. The signal $S_G$ thus periodically has a zero value on a portion of each period $T_1$, this portion of each period $T_1$ corresponding approximately to the portion of each period $T_1$ during which the signal $S_C$ has a zero value. The signal $S_G$ has the specificity of having the phase thereof locked on that of the signal of frequency $f_1$ supplied by the oscillator 102 and has a central frequency $f_{OL}$ which is substantially equal to a whole multiple of $f_1$ ($f_{OL} \approx N.f_1$). This property is due to the fact that, on starting up oscillation, the oscillator 114 has a high elasticity and is locked readily on an harmonic N of the frequency $f_1$ where N is such that the product $N \cdot f_1$ is closest to the free oscillation frequency $f_{OL}$ of the oscillator 114 when in free oscillation. The value of N, and thus that of the frequency $f_{OL}$, are dependent on the value of the voltage $V_{ctrl}$ applied at the input of the oscillator 114.

Figure 5A:
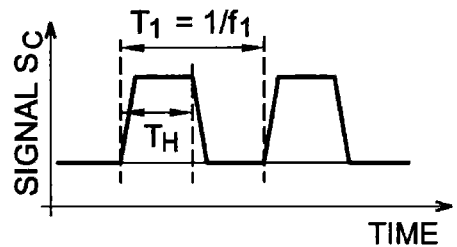
Figure 5B:
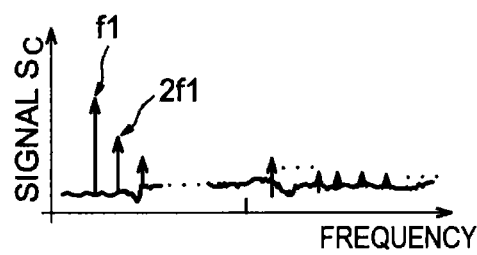

The equivalent spectrum of the signal $S_G$ has an envelope wherein the shape corresponds to a cardinal sine wherein the components are sinusoids of central frequency $N.f_1$. The lines of the spectrum of $S_G$ are spaced at intervals of $f_1$. FIGS. 5A and 5B respectively represent the waveform (time domain) and the spectrum (frequency domain) of the signal Sc.

Figure 6A:
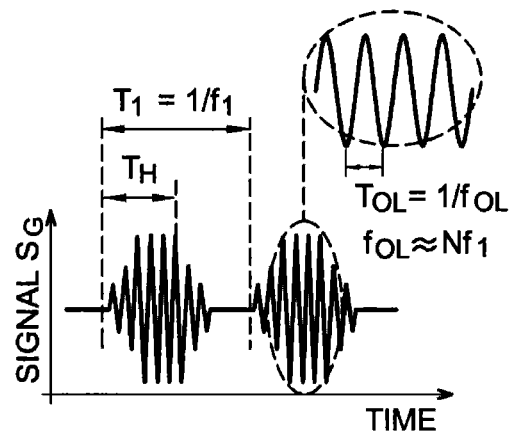
Figure 6B:
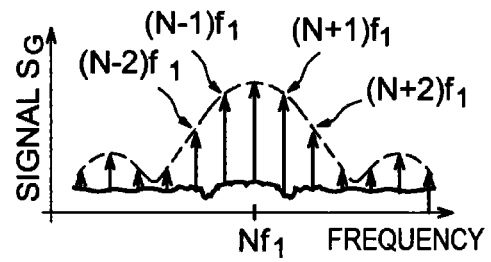

Similarly, FIGS. 6A and 6B respectively represent the waveform and the spectrum of the signal $S_G$. In FIG. 6A, it can be seen that in each oscillations train of the signal $S_G$, the amplitudes of the oscillations are increasing on starting the oscillator 114 and are decreasing on switching off the oscillator 114.

Furthermore, the oscillations of the oscillations trains of $S_G$ are similar, in terms of phase, amplitude and frequency, from one train to another.

In analytical terms, the signal $S_G$ is obtained by means of convolution in the time domain between a windowed sine, of frequency $f_{OL}$ (corresponding to the free oscillation frequency of the oscillator 114) and of window width equal to $T_H$, where $T_H \in ]0, T_1[$, and a Dirac comb of period equal to $T_1$. The signal $S_G$ may thus be expressed in the following form:

$$S_G(t) = \left[\sin(2\cdot\pi\cdot f_{OL}\cdot t)\cdot\prod_{T_H}(t)\right] \otimes \sum_{k=-\infty}^{\infty}\delta(t-k\cdot T_1)$$

$\Pi_{T_H}(t)$ is the windowing function corresponding to:

$$\prod_{T_H}(t) = \begin{cases} 0 & \forall t < 0 \\ 1 & \forall t \in ]0, T_1[ \\ 0 & \forall t > T_H \end{cases}$$

The frequency spectrum of the signal $S_G$ corresponds in this case to:

$$|S_G(f)|_{f>0} = \left[\frac{1}{2}\delta(f-f_{OL})\otimes T_H\cdot\mathrm{sinc}(\pi\cdot f\cdot T_H)\right]\cdot f_1\cdot\sum_{k=-\infty}^{\infty}\delta(f-k\cdot f_1)$$

For each of the lines of frequency $f_i$ of the spectrum of the signal $S_G$ ($f_i$ being multiples of $f_1$), the amplitude $A_i$ of each of these lines may be expressed by the equation:

$$A_i = \frac{1}{2}\mathrm{sinc}(\pi(f_i-f_{OL})\cdot T_H)$$

The signal $S_G$ is then used to obtain at the output of the device 100 a periodic, for example sinusoidal, signal $S_2$, wherein the frequency spectrum comprises a primary lines, or peak, i.e. having a higher value in relation to the other lines, of frequency $f_2$ corresponding to the frequency to be synthesised by the device 100. In addition, in order to obtain a spectrum corresponding to, or approximating, a pure sine without the adjacent lines (corresponding to the lines at $(N+x).f_1$, where x is a whole number, on the spectrum of the signal $S_G$ represented in FIG. 6B, when $f_2=f_{OL}$), the device 100 comprises a frequency recovery circuit 118, or line recovery circuit, wherein the input is connected to the output of the pulsed oscillator 114. The frequency recovery circuit 118 acts as a band-pass filter and rejects the lines adjacent to the frequency to be recovered. At the output of the frequency recovery circuit 118, a periodic signal $S_2$ is obtained wherein the primary line has the frequency $f_2=f_{OL}$, for example a sinusoidal signal with a substantially constant envelope wherein the frequency $f_2$ is for example equal to $N\cdot f_1$. The phase noise of the signal $S_2$ is equal to the phase noise of the signal $S_1$ plus $20\log(N)$, where N is the multiplication factor between $f_1$ and $f_2$:

$$PhN_{dBc/Hz}{}^{f_2} = PhN_{dBc/Hz}{}^{f_1} + 20\log(N)$$

Figure 7A:
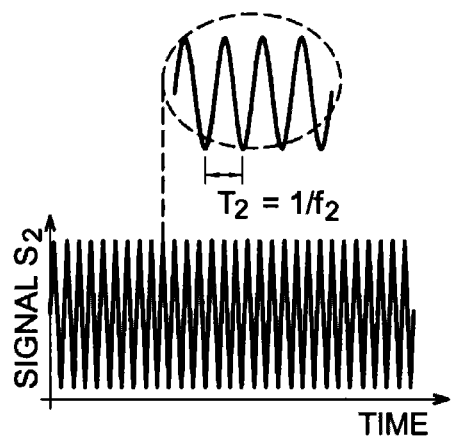
Figure 7B:
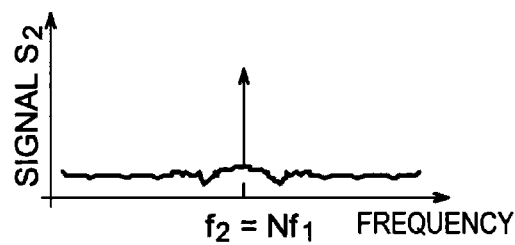

FIGS. 7A and 7B respectively represent the waveform (time domain) and the spectrum (frequency domain) of the signal $S_2$. As such, at the output of the device 100, a signal $S_2$ having a pure spectrum is obtained, i.e. comprising a single line at the frequency $f_2$ locked on $f_{stable}$, any other undesired components having been rejected by the frequency recovery circuit 118.

The oscillators 102 and 114 are for example embodied in the form of differential crossed pairs (resonators coupled with a negative resistance). The oscillator 114 may for example be embodied as described in the document "A 60 GHz UWB impulse radio transmitter with integrated antenna in CMOS65 nm SOI technology" by A. Siligaris et al., Silicon Monolithic Integrated Circuits in RF Systems (SiRF), 2011 IEEE 11th Topical Meeting on, pp. 153-156, 17-19 Jan. 2011. The oscillator 102 may for example be embodied as described in the document "A 17.5-to-20.94 GHz and 35-to-41.88 GHz PLL in 65 nm CMOS for wireless HD applications" by O. Richard et al., Solid-State Circuits Conference Digest of Technical Papers (ISSCC), 2010 IEEE International, pp. 252-253, 7-11 Feb. 2010.

The frequency recovery circuit 118 acts as a very high-selectivity band-pass filter, and may correspond to an injection locked, or synchronised, oscillator circuit (ILO) or a plurality of ILO circuits arranged in cascade. The embodiment of such an ILO is for example described in the document "A 50 GHz direct injection locked oscillator topology as low power frequency divider in 0.13 μm CMOS" by M. Tiebout, Solid-State Circuits Conference, 2003. ESSCIRC '03. Proceedings of the 29th European, pp. 73-76, 16-18 Sep. 2003.

Such an oscillator circuit operates continuously and in the absence of a signal $S_G$ applied at the input (when the signal $S_G$ periodically has a zero value), the circuit 118 outputs a sinusoidal free oscillation signal wherein the frequency $f_{osc\_libre\_118}$ is in the same frequency band as $f_2$ ($f_{osc\_libre\_118} \approx f_2$). The value of the frequency $f_{osc\_libre\_118}$ is only dependent on the value of a control signal $V_{ctrl\_118}$ applied to another input of the frequency recovery circuit 118. When the first input is excited by the pulsed signal $S_G$ output by the oscillator 114, the frequency recovery circuit 118 is locked on the line of the signal $S_G$ closest to $f_{osc\_libre\_118}$. The control signal $V_{ctrl\_118}$ is suitable for positioning $f_{osc\_libre\_118}$ close to $N \cdot f_1$ so as to centre the signal $S_2$ exactly on $N \cdot f_1$, i.e. $f_G$, or on an adjacent line of $N \cdot f_1$. It is thus possible to lock the frequency recovery circuit 118 on a line $(N+1) \cdot f_1$, where i is a whole number (positive or negative or zero), if the control signal $V_{ctrl\_118}$ is such that $f_{osc\_libre\_118}$ is situated close to the line $(N+i) \cdot f_1$.

The frequency f2 suitable for being synthesised by the device 100 is thus configurable and equal to:

$$f_2 = (N+i) \cdot f_1$$

The programming, or setting, of the value of the frequency $f_2$ synthesised is thus performed by means of the parameters N and/or i and/or $f_1$.

The parameters N and i may be modified by means of the value of the control signal $V_{ctrl}$ of the oscillator 114, and the value of the control signal $V_{ctrl\_118}$ of the frequency recovery circuit 118.

A first option for programming the value of the frequency $f_2$ consists of locking the oscillator 114 directly on the desired output frequency such that $f_{OL} = f_2 = N \cdot f_1$. Indeed, as explained above, the oscillator 114 has a high elasticity and tends to be locked readily on a harmonic N of the frequency $f_1$ at the beginning of the oscillations. The value of the oscillation frequency of the oscillator 114 $f_{OL}$ is thus fixed by setting the value of $V_{ctrl}$ such that $f_{OL} = f_2 = N \cdot f_1$. The central frequency $f_{OL}$ of the spectrum of the oscillator 114 is then locked on the line $N \cdot f_1$. The frequency recovery circuit 118 then sees at the input thereof a signal $S_G$ wherein the spectrum is a cardinal sine having lines at intervals of $f_1$ wherein the central line is situated at $f_{OL} = N \cdot f1$. The control signal $V_{ctrl\_118}$ of the frequency recovery circuit 118 is chosen so that the locking takes place on the central line, at the frequency $f_{OL}$, i.e. where i=0. In this way, in this first possible programming of the value of $f_2$, the value of the synthesised frequency f2 is chosen by selecting the value of the control signal $V_{ctrl}$ of the oscillator 114 (determining the value of N), the value of the control signal $V_{ctrl\_118}$ of the frequency recovery circuit 118 being constant and chosen such that i=0).

A second option for setting the value of $f_2$ consists of locking the oscillator 114 on a frequency $f_{OL} = N \cdot f_1$ where N is fixed (i.e. $V_{ctrl}$ having a constant value). The spectrum of the output signal $S_G$ is a cardinal sine having lines at intervals of $f_1$ wherein the central line is at the frequency $f_{OL}$. The control signal $V_{ctrl\_118}$ of the frequency receiver circuit is then chosen so that the locking takes place on one of the lines adjacent to the central line $f_{OL}$ corresponding to the frequency $f_2$ sought (i.e. such that i≠0), in the primary lobe of the cardinal sine spectrum. In this second programming example, the value of the synthesised frequency $f_2$ is chosen by selecting the value of the control signal $V_{ctrl\_118}$ of the frequency recovery circuit 118 (determining the value of i which is different to 0), the value of the control signal $V_{ctrl}$ of the oscillator 114 being constant and chosen such that the value of N is such that the line of frequency $f_2$ is situated in the primary lobe of the cardinal sine spectrum having a central line at the frequency $f_{OL}$ such that $f_{OL} = N \cdot f_1$.

In a third option for programming the value of $f_2$, it is possible to combine the two previous options. This involves adjusting both the control signal $V_{ctrl}$ of the oscillator 114 (adjusting the value of N) and the control signal $V_{ctrl\_118}$ of the frequency recovery circuit 118 (adjusting the value of i) to synthesise the sought frequency $f_2$.

Regardless of the programming option chosen from those described above, the value of $f_2$ may also be modified by setting or selecting the value of the frequency $f_1$ given that the value of $f_1$ corresponds to the interval of the lines in the spectrum of the signal $S_G$.

Figure 8:
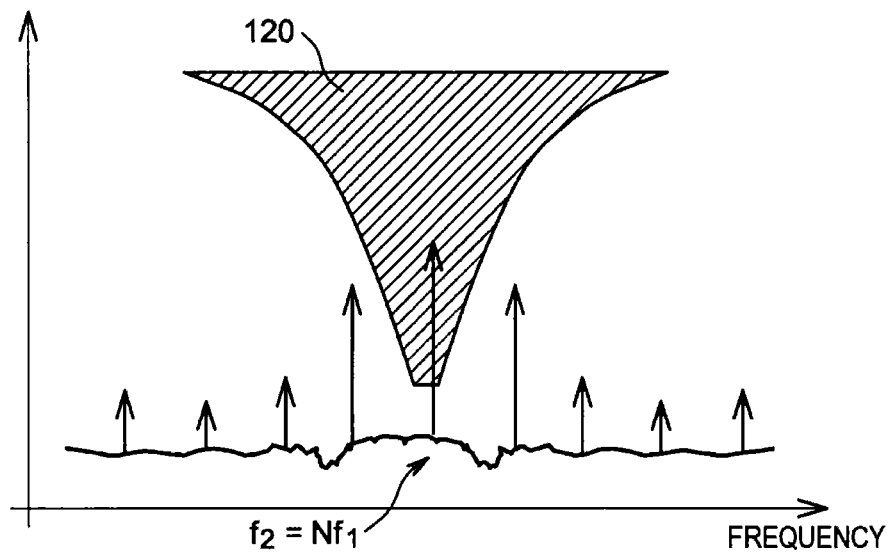
FIG. 8 represents the selectivity of a frequency recovery circuit included in a frequency synthesis device, according to the present invention.

The frequency recovery circuit 118 is suitable for selecting a line situated in the primary lobe of the spectrum of the signal $S_G$ output by the oscillator 114. It acts both as a very selective band-pass filter and as a signal regenerator, by means of the locking performed on the frequency $(N+i)f_1$. The selectivity of the frequency recovery circuit 118, when this corresponds to an injection locked oscillator (ILO) type circuit, is represented in FIG. 8. The zone referenced 120 represents the locking range of such an ILO which, in the example in FIG. 8, is locked on the central line of the spectrum of the signal $S_G$ closest to the free oscillation frequency thereof.

The output signal of this ILO primarily comprises this line but the rejection of adjacent lines is not infinite. As such, the signal $S_2$ obtained at the output of the frequency recovery circuit 118 may not correspond to a pure sinusoidal signal, but to a periodic signal wherein the envelope is never zero (unlike the signal $S_G$ wherein the envelope is periodically zero) and wherein the frequency spectrum exhibits a primary line at the frequency $f_2$. The secondary lines of this spectrum, at multiple frequencies of $f_1$, are attenuated in relation to the secondary lines of the spectrum of the signal $S_G$.

Figure 14A:
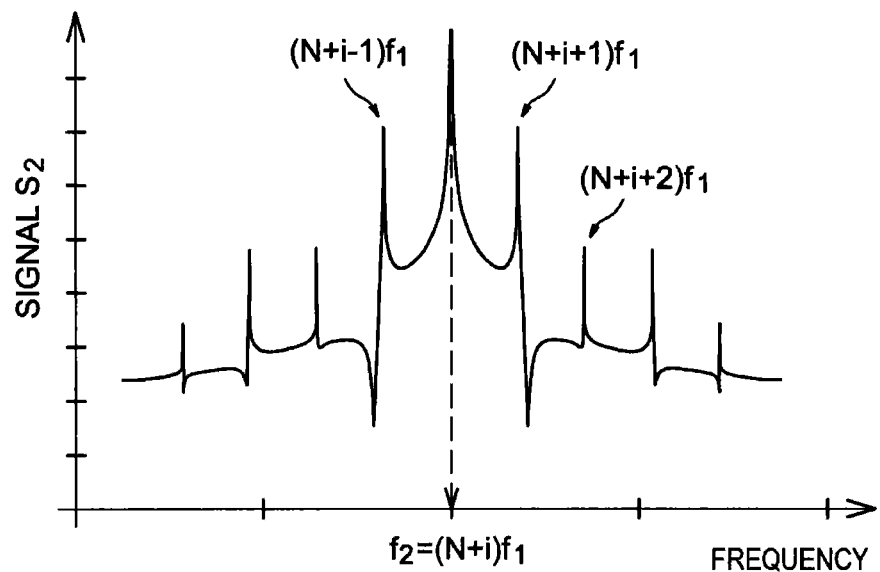
FIGS. 14A and 14B represent signals $S_2$ obtained at the output of a frequency synthesis device, according to the present invention, according to one example of an embodiment.
Figure 14B:
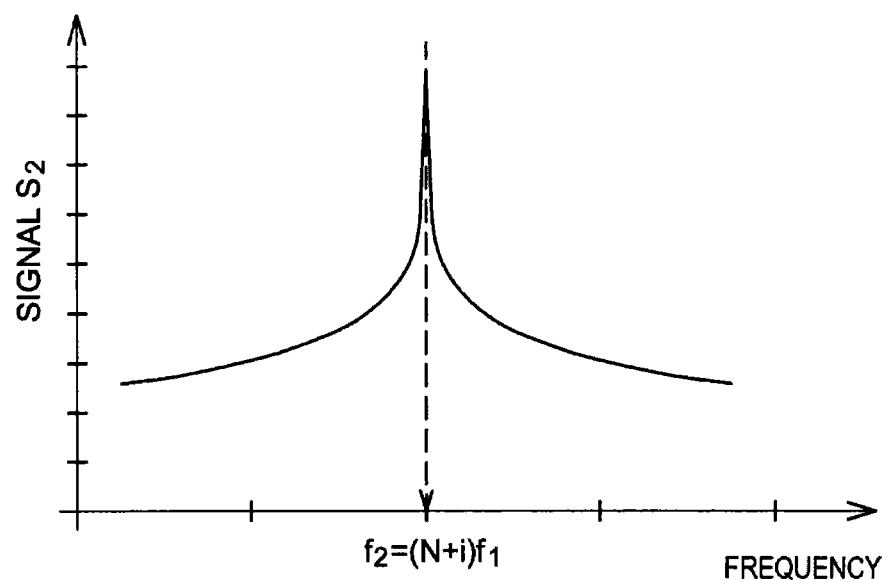

FIG. 14A represents a spectrum of a signal $S_2$ obtained for example with a frequency recovery circuit 118 comprising a single ILO. It is possible to increase this rejection by connecting, in cascade (i.e. in series), one or a plurality of further ILOs to form the frequency recovery circuit 118 and thus attenuate the secondary lines of the spectrum of the signal $S_2$ further, suitable for enhancing the constancy of the envelope of the signal $S_2$. FIG. 14B represents a spectrum of a signal $S_2$ obtained for example with a frequency recovery circuit 118 comprising a plurality of ILOs connected in cascade. It can be seen in this figure that the signal $S_2$ thus corresponds practically to a pure sinusoidal signal.

In respect of the shape of the spectrum of the signal $S_G$, the lower the cyclic ratio of this signal, the wider the primary lobe of the cardinal sine.

As such, a low cyclic ratio involves the presence of a greater number of lines in the primary lobe of the spectrum of the signal $S_G$, and thus of more frequencies suitable for being synthesised by varying i for a given N. This principle is illustrated in FIGS. 9A and 9B representing the waveforms of the signals $S_C$ and $S_G$, and the spectrum of the signal $S_G$, for two signals $S_C$ of different cyclic ratios $\alpha_1$ ($=T_{H1}/T_1$) and $\alpha_2$ ($=T_{H2}/T_1$), the cyclic ratio $\alpha_1$ of the signal $S_C$ represented in FIG. 9A being greater than the cyclic ratio $\alpha_2$ of the signal $S_C$ represented in FIG. 9B.

Alternatively, the frequency recovery circuit 118 may correspond to one or a plurality of band-pass filters connected in cascade. This/these filter(s) is/are embodied such that the central frequency thereof is close to the line of signal $S_G$ of frequency $(N+i).f_1$, suitable for filtering the signal $S_G$ and recovering the line of frequency $(N+i).f_1$ corresponding to the frequency $f_2$ sought. This/these filter(s) is/are also embodied such that they are very selective. This/these filter(s) may be embodied in a number of ways, for example in the form of BAW (bulk acoustic wave), LC (using inductors and capacitors) or SAW (surface acoustic wave) filters. Furthermore, it is also possible for the frequency recovery circuit 118 to comprise one or a plurality of ILOs and one or a plurality of band-pass filters connected in cascade.

Figure 15:
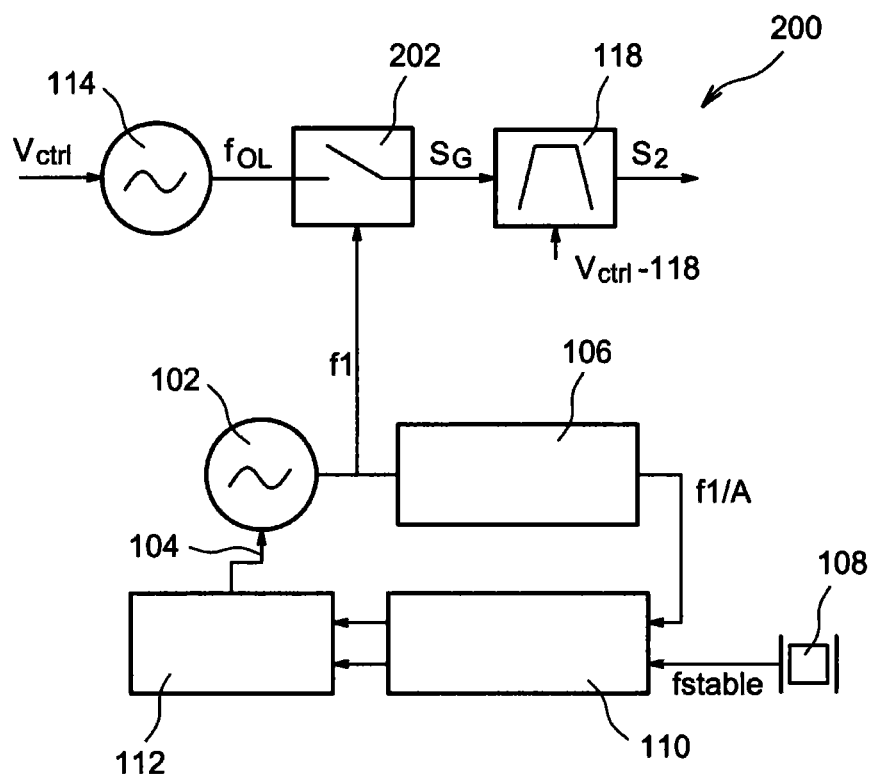
FIG. 15 schematically represents a frequency synthesis device, according to the present invention, according to a second embodiment.

Reference is made to FIG. 15 representing a frequency synthesis device 200 according to a second embodiment.

In relation to the device 100 described above, the oscillator 114 is no longer controlled by a periodically interrupted power supply source, but is powered continuously, supplying a sinusoidal signal of frequency $f_{OL}$. This signal is sent to the input of a switch 202 controlled by the periodic signal $S_1$. The switch 202 is periodically (period $T_1$) in the closed position for a time equal to $T_H$ (for example equal to $T_1/2$ in the case of cyclic ratio of 0.5) and in the open position for a time equal to $T_1-T_H$.

In this case, at the input of the circuit 118, a PROT type signal $S_G$ is obtained, i.e. a train of oscillations of frequency $f_{OL}$ periodically repeated with a repetition period equal to $T_1$. The oscillations of the oscillations trains of $S_G$ are not generally similar, in terms of phase, from one train to another.

In analytical terms, this signal $S_G$ corresponds to the product of a sine of frequency $f_{OL}$ (the free oscillation frequency of the oscillator 114) and a periodic square signal of period $T_1$ and a high-state time $T_H$ where $T_H \in ]0, T_1[$ such that:

$$S_G(t) = \sin(2 \cdot \pi \cdot f_{OL} \cdot t) \cdot \left[ \prod_{T_H} (t) \otimes \sum_{k=-\infty}^{\infty} \delta(t - k \cdot T_1) \right]$$

The frequency spectrum of the signal $S_G$ corresponds in this case to:

$$|S_G(f)|_{f>0} = \frac{1}{2} \delta(f - f_{OL}) \otimes \left[ T_H \cdot \text{sinc}(\pi \cdot f \cdot T_H) \cdot f_1 \cdot \sum_{k=-\infty}^{\infty} \delta(f - k \cdot f_1) \right]$$

For each of the lines of frequencies $f_i$ of the spectrum of the signal $S_G$ (where $f_i=f_{OL}+i.f_1$), the amplitude $A_i$ of each of these lines may be expressed by the equation:

$$A_i = \frac{T_H}{2 \cdot T_1} \text{sinc}\left(\pi \cdot i \cdot \frac{T_H}{T_1}\right)$$

The various alternative embodiments of the frequency recovery circuit 118 described above for the frequency synthesis device 100 may also be applied to the frequency synthesis device 200.

An example of an embodiment of the frequency synthesis device 100 is described hereinafter.

The PLL supplying the signal $S_1$, the current source 116 and the oscillator 114 along with the frequency recovery circuit 118 are embodied for example in 65 nm CMOS technology for example on SOI so as to obtain for example a frequency synthesis device according to the IEEE.802.15.3c standard relating to WPAN, WirelessHD or WiGig networks, wherein signal transmissions are for example carried out in a frequency range between approximately 57 GHz and 66 GHz.

Figure 10:
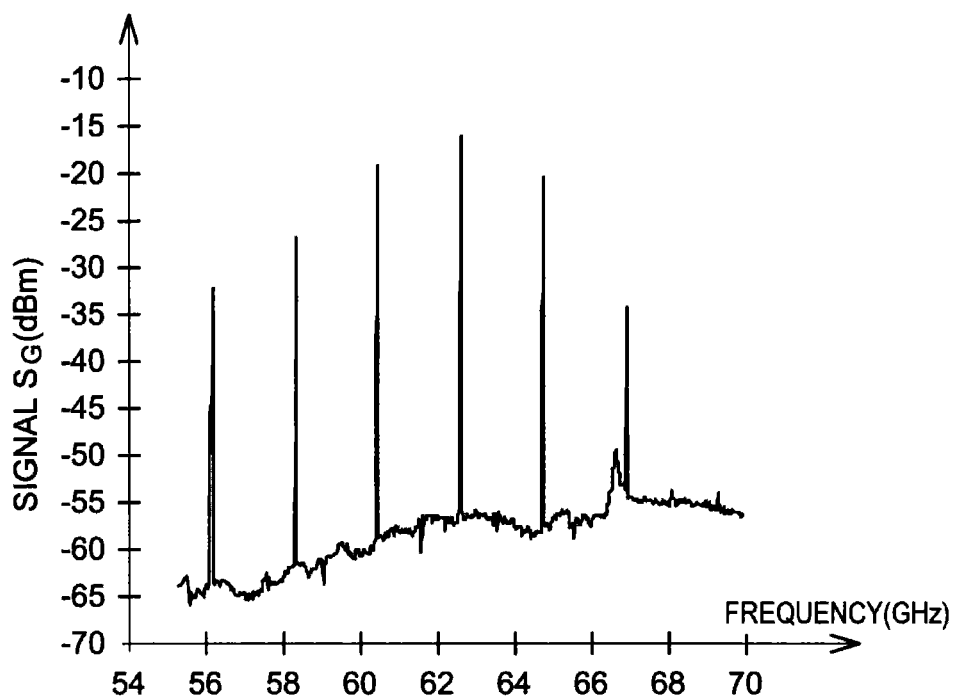
FIG. 10 represents the spectrum of a signal $S_G$ generated in a frequency synthesis device, according to the present invention, according to one example of an embodiment.
Figure 11:
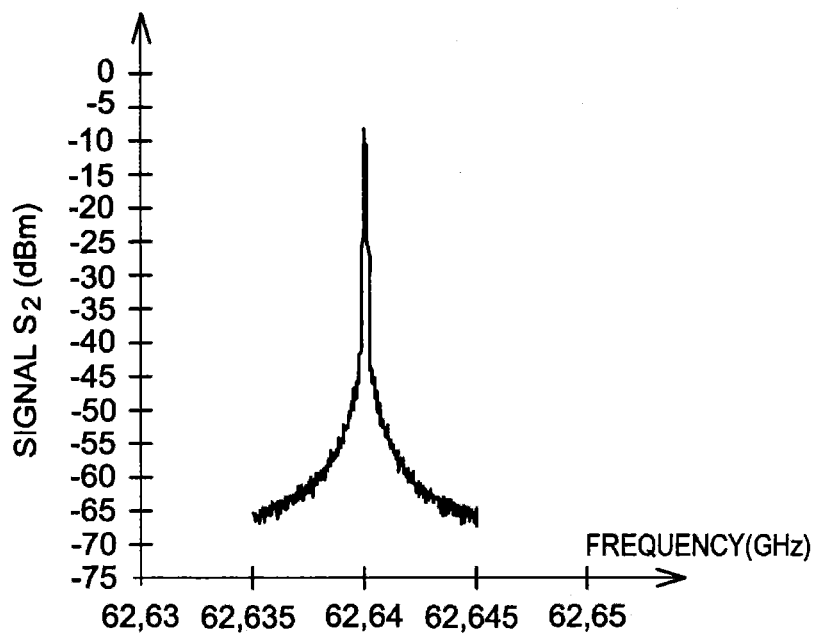
FIG. 11 represents the spectrum of a signal $S_2$ obtained at the output of a frequency synthesis device, according to the present invention, according to one example of an embodiment.
Figure 12:
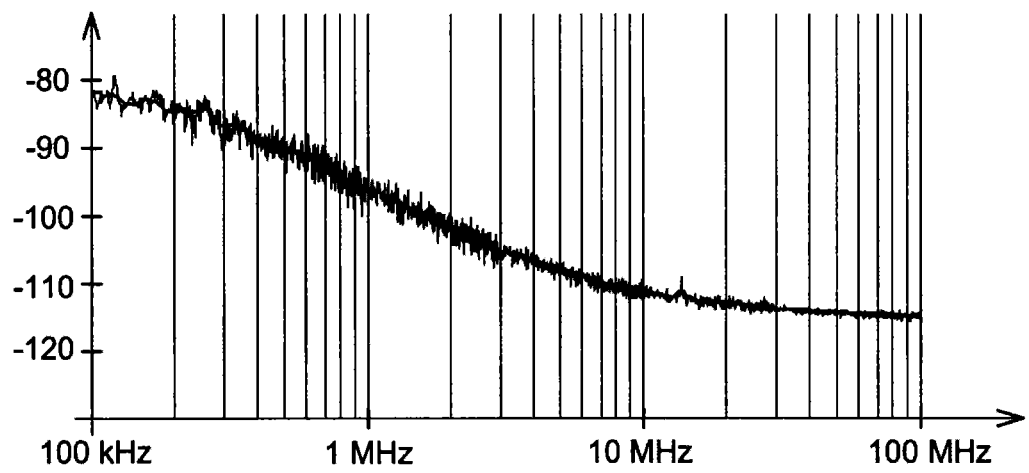
FIG. 12 represents the phase noise of a signal $S_2$ obtained at the output of a frequency synthesis device, according to the present invention, according to one example of an embodiment, FIG. 13 schematically represents a communication system, also according to the present invention, comprising a frequency synthesis device according to the invention.

The elements 102, 106, 108, 110 and 112 are embodied so as to obtain at the output of the oscillator 102 a signal $S_1$ of frequency $f_1$ equal to approximately 2.16 GHz with a reference signal $f_{stable}$=36 MHz. The oscillator 114 is for example embodied so as to output a signal $S_G$ wherein the spectrum is shown in FIG. 10. It can be seen in this spectrum that the various lines, representing different possible communication channels according to the communication standards, are indeed at intervals of $f_1$. The control voltages $V_{ctrl}$ and $V_{ctrl\_118}$ are chosen such that the frequency recovery circuit 118 outputs a signal $S_2$ of frequency $f_2$=62.64 GHz (channel 3 of standards). The spectrum of the signal $S_2$ obtained at the output of such a frequency synthesis device 100 is represented in FIG. 11. Finally, the phase noise of this signal $S_2$ is represented in FIG. 12. This also applies for the embodiment of the frequency synthesis device 200.

Figure 13:
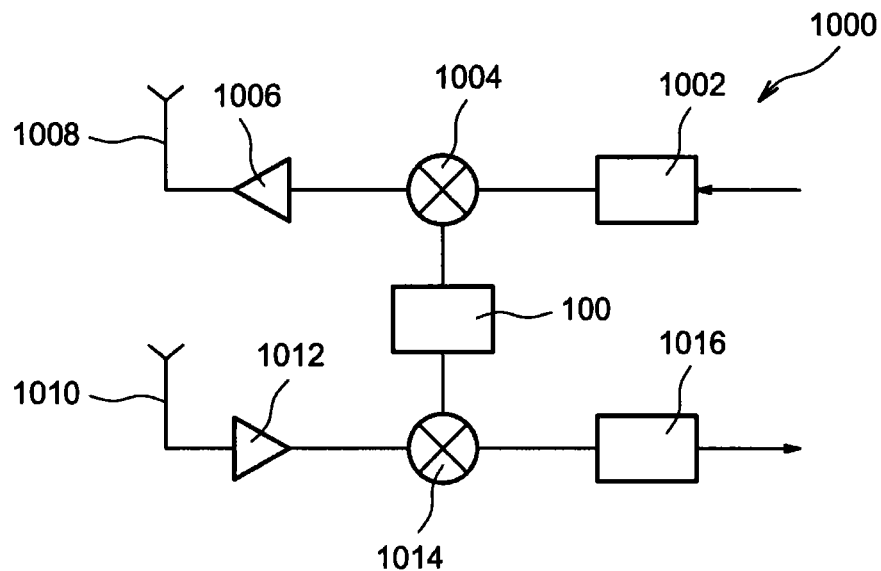

The frequency synthesis device 100 or 200 is for example used in an RF transmission system 1000 of which an example of architecture is represented schematically in FIG. 13. The transmission system 1000 comprises elements for transmitting signals such as a baseband processing circuit 1002 receiving as an input the information to be transmitted, a modulator 1004, a power amplifier 1006 and a transmitting antenna 1008. The frequency synthesis device 100 or 200 is used in conjunction with the modulator 1004 so as to modulate the signal at the sought carrier frequency (frequency $f_2$), for example an RF frequency in the region of one or a plurality of GHz. The transmission system 1000 also comprises elements for receiving signals: a processing circuit such as a receiving antenna 1010, a low-noise amplifier 1012, a demodulator 1014 and a baseband processing circuit 1016.

The frequency synthesis device 100 is used in conjunction with the demodulator 1014 so as to demodulate the received RF signal into baseband.

The invention claimed is:

1. A frequency synthesis device, comprising:
 a first generator configured to generate a periodic signal of frequency $f_i$;
 a second generator, coupled with the first generator and configured to receive as an input the periodic signal of frequency $f_1$ and generate a signal $S_G$ corresponding to a train of oscillations of frequency substantially equal to $N \cdot f_1$, of a time less than $T_1 = 1/f_1$ and repeated periodically at the frequency $f_1$, where N is a whole number greater than 1;

a third generator configured to generate, from the signal $S_G$, a periodic signal of frequency $f_2$ by acting as a band-pass filter applied to the signal $S_G$ and rejecting from a frequency spectrum of the periodic signal of frequency $f_2$ lines other than a primary line of the periodic signal of frequency $f_2$, wherein said frequency spectrum comprises the primary line of frequency $f_2 = (N+i) \cdot f_1$, where i is a whole number.

2. The frequency synthesis device according to claim 1, wherein the frequency spectrum comprising the primary line of frequency $f_2$ is a frequency spectrum of a substantially sinusoidal signal having a substantially constant envelope.

3. The frequency synthesis device according to claim 1, wherein the second generator comprises at least one voltage-controlled oscillator with a free oscillation range that includes the frequency $N \cdot f_1$, the value of N being dependent on a value of first control voltage to be applied at the input of the voltage-controlled oscillator.

4. The frequency synthesis device according to claim 3, wherein the second generator comprises at least one switch connected to an electrical power supply input of the at least one voltage-controlled oscillator and is configured to be controlled by the periodic signal of frequency $f_1$ such that the second generator generates a non-zero power supply voltage of said oscillator only for a portion of each period $T_1$.

5. The frequency synthesis device according to claim 3, Wherein the second generator comprises at least one switch connected to an output of the at least one votage-controlled oscillator and is configured to be controlled by the periodic signal of frequency $f_1$ such that the second generator breaks an electrical connection between said oscillator output and an input of the third generator during a portion of each period $T_1$.

6. The frequency synthesis device according to claim 1, wherein the third generator comprises at least one injection-locked oscillator configured to receive, as an input, the signal $S_G$ and to be locked at least periodically at the frequency $f_2$, a value of i being dependent on a value of a second control voltage configured to be applied at an input of the injection-locked oscillator.

7. The frequency synthesis device according to claim 1, wherein the third generator comprises at least one band-pass filter of central frequency substantially equal to $f_2$.

8. The frequency synthesis device according to claim 1, wherein a value of the frequency $f_1$ is greater than approximately 1 GHz, or a value of the frequency $f_2$, is greater than approximately 10 GHz, or oscillations of the signal $S_G$ are sinusoidal.

9. The frequency synthesis device according o claim 1, wherein the first generator comprises at least one resonating device and a phase-locked. loop configured to control a phase of the periodic signal of frequency $f_1$ output by a voltage-controlled oscillator of the phase-locked loop on a phase of a periodic signal output by the at least one resonating device.

10. The frequency synthesis device according to claim 1, wherein the first generator comprises a resonating device configured to generate the periodic signal of frequency $f_1$.

11. A signal transmission and/or reception device, comprising at least one frequency synthesis device according to claim 1 coupled with a modulator and/or a demodulator of the transmission and/or reception device.

12. A frequency synthesis method, comprising:

generating a periodic signal of frequency $f_1$;

generating, from the periodic signal of frequency $f_1$, a signal $S_G$ corresponding to a train of oscillations of frequency substantially equal to $N \cdot f_1$, of a time less than $T_1 = 1/f_1$ and repeated periodically at frequency $f_1$ where N is a whole number greater than 1;

generating, from the signal $S_G$, a periodic signal of frequency $f_2$ using a band-pass filtering function applied to the signal $S_G$ and rejecting from a frequency spectrum of the periodic signal of frequency $f_2$ lines other than a primary line of the periodic signal of frequency $f_2$, wherein said frequency spectrum comprises the primary line of frequency $f_2 = (N+i) \cdot f_1$, where i is a whole number.

13. A method for producing a frequency synthesis device, comprising:

producing a first generator configured to generate a periodic signal of frequency $f_1$;

producing a second generator, coupled with the first generator and configured to receive, as an input, the periodic signal of frequency $f_1$ and to generate a signal $S_G$ corresponding to a train of oscillations of frequency substantially equal to $N \cdot f_1$, of a time less than $T_1 = 1/f_1$ and repeated periodically at the frequency $f_1$, where N is a whole number greater than 1;

producing a third generator configured to generate, from the signal $S_G$, a periodic signal of frequency $f_2$ by acting as a band-pass filter applied to the signal $S_G$ and rejecting from a frequency spectrum of the periodic signal of frequency $f_2$ the lines other than a primary line of the periodic signal of frequency $f_2$, wherein said frequency spectrum comprises the primary line of frequency $f_2 = (N+i) \cdot f_1$, where i is a whole number.

* * * * *